United States Patent [19]

Muehldorf et al.

[11] 4,058,767
[45] Nov. 15, 1977

[54] APPARATUS AND PROCESS FOR TESTING AC PERFORMANCE OF LSI COMPONENTS

[75] Inventors: Eugen I. Muehldorf, Potomac, Md.; Robert R. Elam, Manassas, Va.

[73] Assignee: International Business Machines Corporation, Armonk, N.Y.

[21] Appl. No.: 572,806

[22] Filed: Apr. 29, 1975

[51] Int. Cl.² .................................... G01R 15/12
[52] U.S. Cl. ............................ 324/73 R; 324/73 AT; 235/302; 235/304.1
[58] Field of Search ..................... 324/73 AT, 73 R; 235/151.31, 152, 153 AC

[56] References Cited

U.S. PATENT DOCUMENTS

| 3,673,397 | 6/1972 | Schaefer | 235/153 |
|---|---|---|---|
| 3,740,646 | 6/1973 | McMahon, Jr. | 324/73 R |
| 3,812,426 | 5/1974 | Illian | 324/73 R |
| 3,832,535 | 8/1974 | De Vito | 235/153 AC |
| 3,883,801 | 5/1975 | Hess | 324/73 R |
| 3,887,869 | 6/1975 | Connolly et al. | 324/73 R |
| B 394,712 | 1/1975 | Patti | 324/73 R |

Primary Examiner—Rudolph V. Rolinec
Assistant Examiner—Vincent J. Sunderdick
Attorney, Agent, or Firm—Joseph C. Redmond, Jr.

[57] ABSTRACT

Apparatus for determining the AC or switching delay behavior of an LSI circuit. The apparatus measures the signal propagation along different circuit paths to determine the AC characteristic. Each LSI circuit line under test is connected to a display through a line counter logic block. Each line counter logic block responds to a begin count pulse, counter pulses and stop or reset pulses. The logic block provides numerical count to the display until the line under test switches. The numerical counts on the display for the various lines indicates the AC performance of each circuit as they respond to input data over a selected timing interval.

11 Claims, 5 Drawing Figures

APPARATUS AND PROCESS FOR TESTING AC PERFORMANCE OF LSI COMPONENTS

BACKGROUND OF THE INVENTION a. Field of Invention

This invention relates to apparatus and processes for automatically testing of electric circuits. More particularly, the invention relates to apparatus and processes for testing LSI components.

b. Description of the Prior Art

Data processing machines employ semiconductors to perform logical and memory operation at switching speeds of the order of 10 to 100 nanoseconds. Semiconductor components are fabricated in large scale integration (LSI) technologies. Several thousand circuits may be incorporated into a chip less than a quarter inch by a quarter inch in area. The circuits are combined to achieve the various machine functions. Each component must be tested for steady state or DC operation and dynamic or AC operation to verify that machine functions will be achieved. Testing of LSI components is becoming increasingly difficult because (1) switching states of the various active devices in the component change so fast (nanoseconds) that little or no stable or DC level is achieved to indicate whether a circuit is in a binary '1' or binary '0' condition and (2) the switching states of the active elements in the circuit change differently for identical circuits because of differences in distributed R, L, and C experienced by the circuit. A publication "Digest of Papers 1974 Semiconductor Test Symposium", of Nov. 5-7, 1974, sponsored by the IEEE Computer Society describes additional problems in dynamic time or AC testing of LSI components.

One method of testing is arranged so that the correct operation of the test system is not dependent on rise time, fall time or minimum delay of any individual circuit in a logic unit. The only dependency is that the total delay through a number of stages of logic is less than some known value. Such a test configuration is referred to as level sensitive scan logic as described in U.S. Pat. Nos. 3,761,695 or 3,783,254 or 3,784,907 all assigned to the present assignee. Briefly, the components under test include DC latch circuitry associated with the combinatorial and sequential logic networks. The latch circuitry is positioned along with the combinatorial logic networks and arranged in sets. The sets of latch circuitry are coupled through combinatorial logic to other sets of latches controlled by clock trains. All of the latches are coupled together to form a single shift register having a single input a single output in shift controls. Logic networks associated with different clocks can be isolated from a logic network under test. Test patterns are provided one at a time to the logic units under test. Each set of test patterns is shifted into the register and provided as input signals to the logic unit network. The contents of the shift register latches are measured at the unit outputs against the expected response of the particular test pattern thereby obtaining initial indication of the state of the storage circuits. Repeating this procedure with additional test patterns provides a clear indication of the test status of the individual logic networks and the component as a whole.

In another prior art test method, a circuit under test is connected in a close loop with input drive circuitry, delay and decoding circuitry. A test pattern is entered into the circuits as well as to the output of the apparatus. Isolations occur as a result of the closed loop connection. The isolations are measured by sequentially changing the binary signals applied to the apparatus and are an indication of the test status of the apparatus.

The prior art test methods either include circuit elements in a chip which take away from the potential logic performance or require complex test systems to determine the AC operation of the circuits. Both test systems are expensive and are limited in the degree to which they can test components.

SUMMARY OF THE INVENTION

One object of the invention is test apparatus and processes for measuring AC switching performance of circuits that switch at high speeds, typically of the order of 10 to 20 nanoseconds.

Another object is test apparatus and processes for measuring AC switching performance of all types of circuits employed in data processing machines.

Another object is a simple and inexpensive test apparatus and process that measures AC performance of LSI components by logic control of a counter-voltage integrator.

In one illustrative embodiment a circuit element under test is adapted to receive input signals for test patterns at one set of terminal points and provide output signal patterns at another set of terminal points depending upon the switching performance of the active elements included in the element under test. A line counter element is directly attached to each output line. Each counter element includes logic elements responsive to control signals that are correlated with test patterns to the circuit under test. The counter element provides a numerical output indicative of the switching behavior of the line under test during a defined time inverval in which the logic element is operable. A display means presents the numerical output from each logic element as an indication of the AC switching performance of the circuit under test.

The testing process for measuring the AC performance of LSI circuits comprises the steps of (a) providing a test pattern to an LSI device under test having a plurality of output terminals, each terminal connected to a line counter logic element, (b) providing set-up signal to activate each counter logic element, (c) providing a begin count and counter pulses to each line counter logic element, a counter element in the line counter logic element increasing in count until an output line switches, (d) providing stop signals to the line counter logic element, and (e) displaying the counter values, the numerical values displayed indicating the AC switching performance of the output terminals for the device under test.

A feature of the invention is a line counter logic element that translates the AC switching behavior of a circuit operating at speeds of nanoseconds into a numerical value indicative of the switching performance of the circuit.

Another feature of the invention is a plurality of line counter logic elements that respond to suitable control signals to generate numerical values indicative of the relative switching performance of output lines from a LSI device responsive to a test pattern.

Another feature of the invention is a process for applying (1) a test pattern to a device under test, (2) begin, count, (3) counting, and (4) reset pulses to a plurality of line counter logic elements responsive to the respective output lines of the LSI device whereby the AC switching performance of the device can be determined.

DESCRIPTION OF THE DRAWING

FIG. 4 is a logic embodiment of another line counter logic element included in the test system of FIG. 2.

FIGS. 5A-5K are timing diagrams of input pulses supplied to the test system of FIG. 2.

DESCRIPTION OF THE PREFERRED EMBODIMENT

Figure 1:
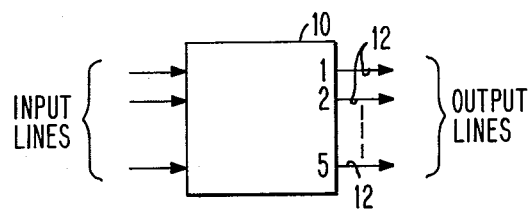
FIG. 1 is a schematic of an LSI device under test.

FIG. 1 shows an LSI device 10 to be tested. The LSI device 10 may be a logic chip, described for example in U.S. Pat. No. 3,697,318; a memory chip, described for example in U.S. Pat. No. 3,508,209 or a macro device which employs both logic and memory. Test patterns are applied to the plurality of input lines 11 and are intended to functionally test the device 10 in operation, typically at switching performance expected in a data processing machine. Test pattern generation for LSI devices are described in a paper entitled "Algorithms for Detection of False and Logic Circuits" by W. G. Bouricius, et al which was published in *Research Report RC 3117*, by the IBM Thomas J. Watson Research Center on Oct. 19, 1970. An algorithm for computation of test for failures is described in "Diagnosis of Automata Failures: A Calculus And Method" by J. Paul Roth in the *IBM Journal Research and Development*, July 1966. These papers describe how to develop program algorithms for test generations and test evaluations. These include the generation of the assumed fault data necessary for the automatic test generation system. It should be understood that the invention of the application does not reside in generation of test patterns for application to a device under test but rather is directed to apparatus and a method of testing the device when the patterns are applied to it.

There exists a large number of possibilities of switching processes occurring at different order at the output lines 12. For $n$ output lines the possibilities are given by the relationship:

$$P = \sum_{q=1}^{q=n-1} \left( n! + \frac{n!}{(n+1-q)!} q \right) \quad (1)$$

$P$ = Number of possible cases of switching processes occurring at $n$ output lines
$q$ = Counter variable for the recursive formula (1)
$n$ = Number of output lines on which switching is to be observed
$n! = 1.2.3.4 \ldots n$ P includes the switching cases where two or more lines switch simultaneously. The number of instances where two lines switch simultaneously increases rapidly as the number of lines is as given by the following:

| n | P |
|---|-----|
| 2 | 3   |
| 3 | 13  |
| 4 | 69  |
| 5 | 431 |

The relative switching times of the output lines is significant to achieve desired data processing functions, particularly as the machine speeds increase. An erroneous switching order from a circuit component may result in the failure of the machine to achieve the desired function.

Figure 2:
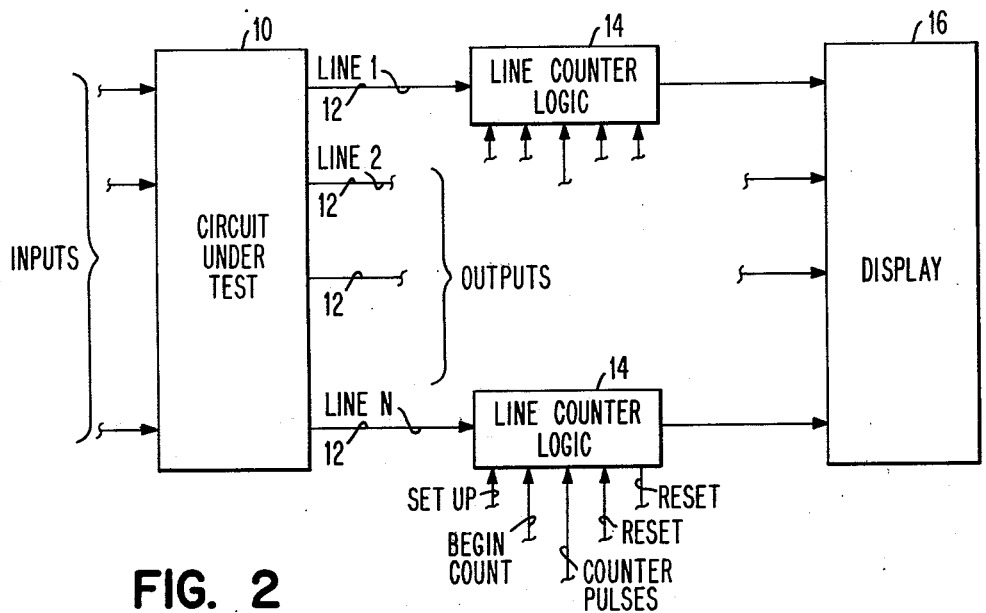
FIG. 2 is a schematic of a test system of the present invention including a plurality of line counter logic elements.

FIG. 2 shows a test system which measures the relative switching order from an LSI chip of the type shown in FIG. 1 operating at switching speeds of the order of 10 to 20 nanoseconds. The chip has one to $n$ output lines 12. Each line is connected to a line counter logic element 14. Each element 14 provides an input to a display unit 16. The elements 14 will be more fully described in conjunction with FIGS. 3, 4, and 5. The display unit is a conventional digital display or volt meter for each line. Alternatively, the outputs may be combined in a single display, as for example a high speed delayed sweep oscilloscope described for example in an article in the "Digest of Papers 1974 Semiconductor Test Symposium", pages 7-32, supra. Each element is responsive to a set-up; begin count, reset, stop signals and counter pulses, as will be described in more detail hereinafter.

Figure 3:
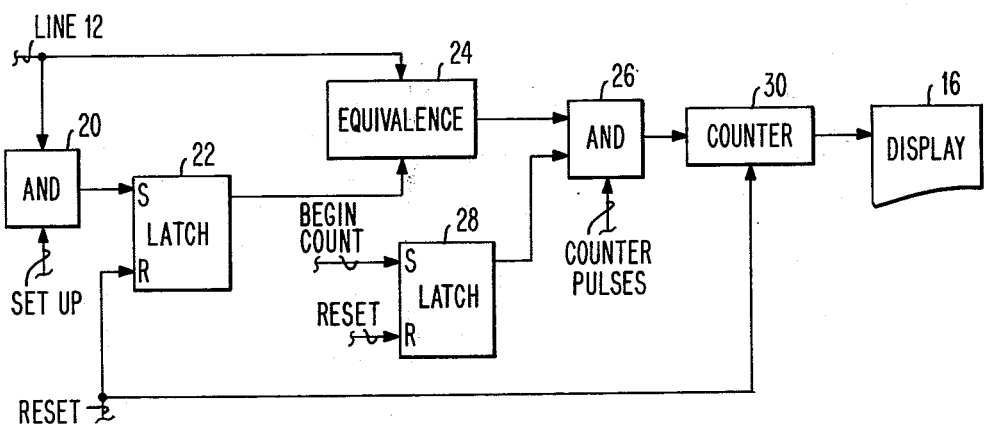
FIG. 3 is a logic representation of a line counter logic element included in the test system of FIG. 2.

In FIG. 3 the line 12 is connected to an AND circuit 20 and an equivalent or not Exclusive OR circuit 24. The AND and equivalent circuits are well known, being described in the text "Pulse and Digital Circuits" by J. Millman and H. Taub, McGraw Hill Book Co., Inc., 1956, Chapter 13. The AND circuit 20 also responds to a set-up signal and provides a set input to a standard latch 22. A reset signal is also provided to the latch 22 which provides the other input to the circuit 24. The latch circuit is the standard flip-flop also described in the text by J. Millman and H. Taub, supra. An AND circuit 26 is responsive to the circuit 24, the latch 28, and the counter pulses. The latch 28 is responsive to the begin count and the reset or stop signal. A counter 30 is responsive to the AND circuit 26 and also to the reset or stop signal. The counter is adapted to count at a rate on the order of a count per nanosecond and is described, for example in the text "Basic Electronic Instrument Handbook" by C. F. Coombs, McGraw Hill, New York, N.Y., published 1972, specifically page 33.7.

In FIG. 5A, the counter pulses are provided as an input to the AND gate 26. The counter 30, however, is not activated until the AND gate 26 responds to signal changes from the circuit 24 and the latch 28. The circuit 24 responds to the output signal on the line 12 from the circuit under test and the latch 22. A set-up pulse to the AND circuit 20, as shown in FIG. 5B together with the signal on the line 12, as shown in 5D, activates the latch 22 to provide an input to the circuit 24, as shown in FIG. 5F. The circuit 24 provides an input to the AND gate 26, as shown in FIG. 5H. Shortly thereafter, a begin count signal, as shown in FIG. 5C, is provided to the latch 28 which provides an up level to the AND gate 26, as shown in FIG. 5I. The up level activates the AND gate 26 which initiates the counting of the counter 30, as shown in FIG. 5J. When the output signal on the line 12 drops, as shown in FIG. 5D, the circuit 24 is deactivated, as shown in FIG. 5H and the counting pulses to the counter 30 are blocked, as shown in FIG. 5J. The number recorded in the counter appears in the display for the particular output line. Correspondingly, numbers appear in their respective displays to indicate the switching time for the particular output line. The relative switching times for the output lines can be determined by observing the respective numerical values in the display. Alternatively, a high speed delay sweep oscilloscope can provide a real time comparisons on all output terminals being compared.

A reset signal, shown in FIG. 5G, is provided at the end of the comparsion, or after the displays are read to measure the relative switching times of the output lines to a succeeding test pattern. The reset signal changes the latch 22 from an up state to a down state as shown in FIG. 5F. The reset pulse also returns the counter 30 to the beginning state. The reset pulse can also serve as the stop pulse to the latch 28 to change the output thereof from an up state to a down state as shown in FIG. 5J. The line counter logic element is now ready for the next test pattern.

A binary '0' on the line 12 prevents an output from the AND circuit 20 even when a set-up signal is provided thereto, as shown in FIGS. 5B and 5E. The latch 22 remains in a down state, as shown in FIG. 5F but the circuit 24 as an Exclusive OR provides an up state to the AND gate 26 because of both down inputs thereto, as shown in FIGS. 5D and 5F. The begin count pulse, as shown in FIG. 5C results in the latch 28 providing an up level to the AND gate 26, as shown in FIG. 5J. The counting pulses are provided by the AND gate 26 to the counter 30 as shown in FIG. 5J until the output line 12 switches from the binary '0' to binary '1' state, as shown in FIG. 5D. A reset pulse (not shown) is provided to the latch 28. After the displays are read the line counter logic elment is ready for the next test pattern and the set-up, begin count signals are provided to read the switching time of the output line.

Figures 4, 5:
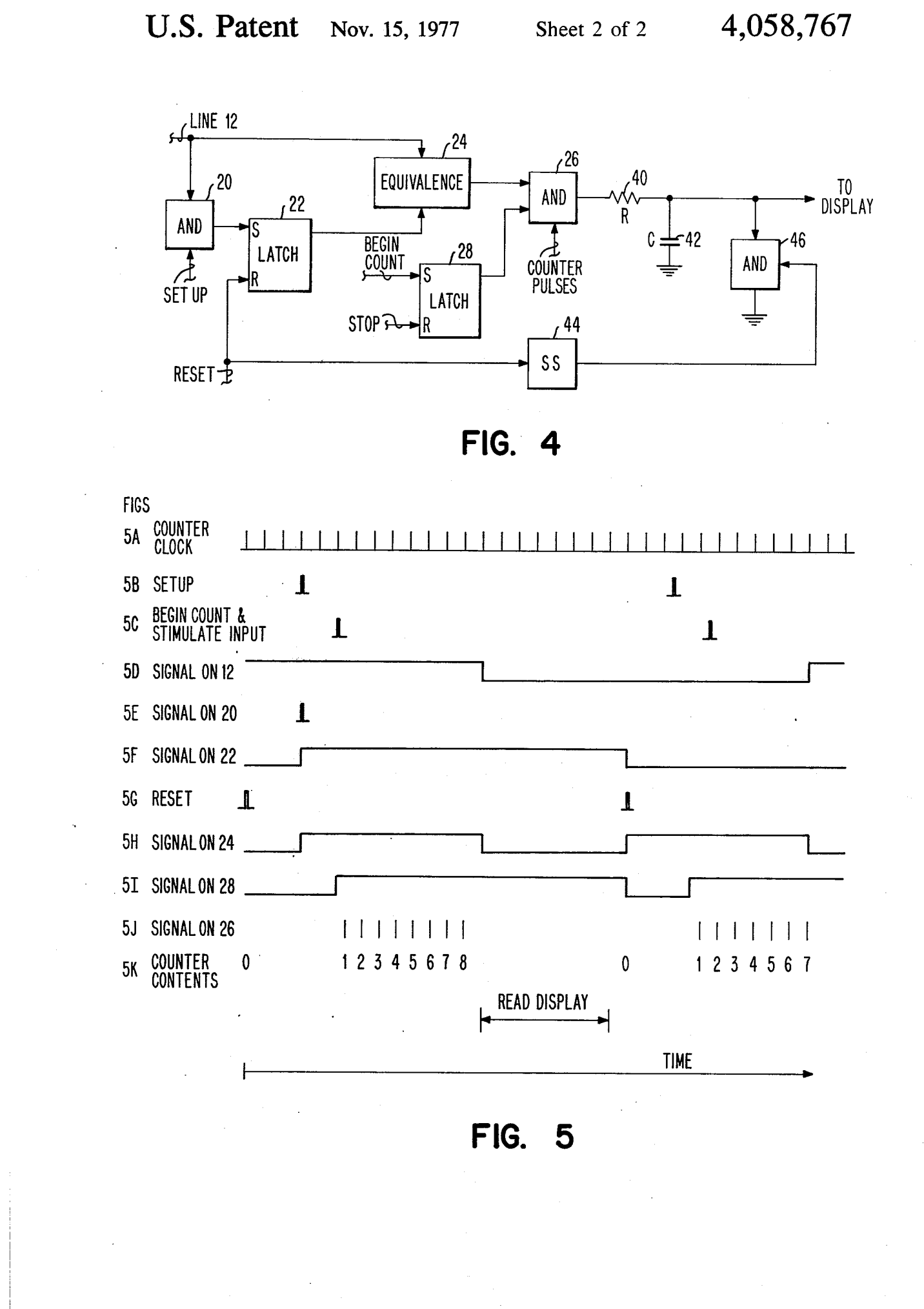

FIG. 4 shows the same line counter logic element as FIG. 2 except an integrating circuit comprising resistor 40 and capacitor 42 are substituted for the counter 30 of FIG. 3. Each counter pulses increases the charge in the capacitor 42 which builds to a voltage that can be observed on a digital volt meter (not shown). A single shot 44 and AND gate 46 are adapted to discharge the capacitor 42. The single shot 44 responds to the reset signal when the latches 22 and 28 are reset.

While the invention has been particularly shown to describe with reference to preferred embodiments thereof, it will be understood by those skilled in the art that the foregoing and other changes in form and detail may be made therein without departing from the spirit and the scope of the invention.

What is claimed is:

1. A process for testing the AC performance of LSI circuits comprising the steps of
   a. providing a test pattern to an LSI circuit under test,
   b. sensing a plurality of output signals from the circuit under test by one or more logic elements to translate the plurality of output signals into numerical values indicative of the relative switching performance of the circuit,
   c. providing a plurality of different control signals to each logic element, the control signals being correlated with the test pattern to the circuit under test, and
   d. displaying the status of each logic element as an indication of the AC performance of the LSI circuit under test.

2. The process of claim 1 wherein the control signals comprise a set-up, begin count, counter pulses and reset pulses.

3. The process of claim 2 wherein the set-up pulse is provided at the beginning of a test cycle to activate the various logic elements.

4. The process of claim 2 wherein the begin count pulse is provided to activate the counting action of the logic element in conjunction with a plurality of counting pulses.

5. The process of claim 4 wherein reset pulses are provided at the end of a test cycle to activate the display of each logic element and return the logic element to an initial condition for the next test cycle after observation of the display.

6. A system for determining the AC performance of an LSI circuit comprising
   a. a circuit element under test responsive to an input signal pattern and providing an output signal pattern on a plurality of output lines,
   b. a line counter logic element included in each output line,
   c. control signals to each logic element, the control signals correlated with the input signal to the circuit under test to provide a numerical output from each logic element indicative of the switching behavior of the line under test during a time interval, and
   d. means displaying the numerical output from each logic element whereby the AC performance is displayed for the circuit under test.

7. The test system of claim 6 wherein each line counter logic element comprises an equivalence circuit responsive to an output line, means for generating a reference signal corresponding to a binary signal present on the output line, means for employing the output of the equivalence circuit to control the incrementing of a counter and means displaying the counter indication at the end of the test cycle.

8. The line counter logic element of claim 7 wherein the means for generating a reference signal comprises a combinatorial gate circuit responsive to a set-up signal and a bistable circuit responsive to the output of the combinatorial gate and a reset signal, the bistable circuit providing an input to the equivalence circuit which corresponds to the binary signal present on the output line.

9. The line counter logic element of claim 8 wherein the means for controlling a counter comprises a bistable circuit which provides a first input to a combinatorial gate which is also responsive to the output from the equivalence circuit and a plurality of counting pulses, the output of the combinatorial gate activating a summing circuit for the counter pulses when a begin count pulse is provided to the bistable circuit.

10. The system claim of claim 9 wherein the summing circuit is a counter for binary pulses and means responsive to a reset signal for returning the counter to an initial state.

11. The system claim of claim 10 wherein the summing circuit is a voltage integrator for providing an output voltage corresponding to the number of counter pulses and means for discharging the integrator at the conclusion of a test cycle.

* * * * *